United States Patent
Jacobson et al.

(10) Patent No.: US 9,564,266 B2
(45) Date of Patent: Feb. 7, 2017

(54) POWER CONVERTER MAGNETICS ASSEMBLY

(71) Applicant: Raytheon Company, Waltham, MA (US)

(72) Inventors: Boris S. Jacobson, Westford, MA (US); Stephen R. Elkins, Franklin, MA (US); Bradley S. Jaworski, Bedford, MA (US)

(73) Assignee: Raytheon Company, Waltham, MA (US)

( * ) Notice: Subject to any disclaimer, the term of this patent is extended or adjusted under 35 U.S.C. 154(b) by 129 days.

(21) Appl. No.: 14/530,014

(22) Filed: Oct. 31, 2014

(65) Prior Publication Data

US 2016/0128235 A1 May 5, 2016

(51) Int. Cl.
*H01F 27/02* (2006.01)
*H02M 7/00* (2006.01)
*H05K 7/20* (2006.01)

(52) U.S. Cl.
CPC .......... *H01F 27/025* (2013.01); *H02M 7/003* (2013.01); *H05K 7/20927* (2013.01)

(58) Field of Classification Search
CPC H05K 7/20509; H05K 7/20927; H05K 13/04; H05K 7/20218; H05K 7/20536; H05K 7/20709; H05K 7/20845; H05K 7/2089; H05K 7/20872; H02M 7/003; H01F 27/025; H01F 27/16; H01L 23/4332; H01L 23/4338; H01L 23/473
USPC ............................... 361/688–723; 165/41–43
See application file for complete search history.

(56) References Cited

U.S. PATENT DOCUMENTS

| | | | |
|---|---|---|---|
| 3,043,000 A | 7/1962 | Hatfield et al. |
| 4,268,957 A | 5/1981 | Sbuelz |
| 4,623,771 A | 11/1986 | Sakino |
| 4,678,497 A | 7/1987 | Petersen |
| 4,678,986 A | 7/1987 | Barthelemy |
| 5,434,770 A | 7/1995 | Dreifuerst et al. |
| 5,517,755 A | 5/1996 | Wright |
| 5,545,966 A | 8/1996 | Ramos et al. |
| 5,625,545 A | 4/1997 | Hammond |
| 5,808,535 A | 9/1998 | Delucia |
| 5,864,475 A | 1/1999 | Ikawa et al. |

(Continued)

FOREIGN PATENT DOCUMENTS

KR 10-1198031 B1 11/2012
WO WO 2013/061799 A1 5/2013

OTHER PUBLICATIONS

Giri et al, "Common-Duty-Ratio Control of Input-Series Connected Modular DC-DC Converters with Active Input Voltage and Load-Current Sharing", IEEE Transactions on Industry Applications, vol. 42, No. 4, Jul./Aug. 2006.

(Continued)

*Primary Examiner* — Anthony Haughton
*Assistant Examiner* — Yahya Ahmad (57) ABSTRACT

A power converter magnetics assembly is disclosed. The power converter magnetics assembly can include an interface panel, a magnetic component mounted to the interface panel to form a magnetics subassembly, and a chassis coupled to the magnetics subassembly. The chassis can have a cavity with an opening. The magnetic component can be received within the cavity and the interface panel can be disposed over the opening and secured to the chassis to form an enclosure about the magnetic component.

20 Claims, 6 Drawing Sheets

(56) References Cited

U.S. PATENT DOCUMENTS

| | | | |
|---|---|---|---|
| 5,933,339 A | 8/1999 | Duba | |
| 5,986,909 A | 11/1999 | Hammond | |
| 6,218,792 B1 | 4/2001 | Berth et al. | |
| 6,236,580 B1 | 5/2001 | Aiello et al. | |
| 6,384,703 B1 | 5/2002 | Ramos et al. | |
| 6,661,134 B2 | 12/2003 | Sunaga | |
| 6,885,268 B2 | 4/2005 | Choi | |
| 6,940,715 B2 | 9/2005 | Beihoff et al. | |
| 7,002,443 B2 | 2/2006 | Ness et al. | |
| 7,142,085 B2 | 11/2006 | Phadke | |
| 7,489,226 B1* | 2/2009 | Chignola | H01F 27/2804 336/229 |
| 8,009,004 B2 | 8/2011 | Ahangar et al. | |
| 8,064,198 B2 | 11/2011 | Higashidani et al. | |
| 8,383,939 B2 | 2/2013 | Gotou | |
| 8,686,288 B2 | 4/2014 | Kalayjian et al. | |
| 9,048,721 B2 | 6/2015 | Abe et al. | |
| 2003/0133268 A1* | 7/2003 | Radosevich | H02M 1/44 361/704 |
| 2005/0068147 A1* | 3/2005 | Skibinski | H01F 27/027 336/200 |
| 2008/0174926 A1 | 7/2008 | Evans et al. | |
| 2010/0025126 A1* | 2/2010 | Nakatsu | B60L 11/00 180/65.1 |
| 2010/0308939 A1 | 12/2010 | Kurs | |
| 2011/0096496 A1 | 4/2011 | Doo et al. | |
| 2014/0126154 A1* | 5/2014 | Higuchi | B60L 11/1803 361/714 |
| 2014/0132380 A1* | 5/2014 | Jacobson | H01F 27/025 336/60 |
| 2014/0168900 A1* | 6/2014 | Korich | H05K 7/1432 361/709 |
| 2015/0015356 A1 | 1/2015 | Jacobson et al. | |
| 2015/0163962 A1* | 6/2015 | Suzuki | H02M 7/003 361/699 |

OTHER PUBLICATIONS

Prasai, "Utilizing stray capacitances of a Litz wire", Proc. Inst. Elect. Eng., 2005.

Skutt et al, "Leakage Inductance and Termination Effects in a High-Power Planar Magnetic Structure", IEEE PESC, 1994.

Sullivan, "Optimal Choice for Number of Strands in a Litz-Wire Transformer Winding", IEEE Transactions on Power Electronics, 1999, vol. 14, No. 2, pp. 283-291.

Tang et al, "Stranded Wire With Uninsulated Strands as a Low-Cost Alternative to Litz Wire" PESC Jun. 2003, pp. 289-295.

* cited by examiner

POWER CONVERTER MAGNETICS ASSEMBLY

BACKGROUND

High power magnetics assemblies are often used in galvanically-isolated power converters for medium voltage and high voltage applications, such as energy storage modules, micro-grids, power supplies, and AC/DC converters. Conventionally, such assemblies comprise a number of individual magnetic components or devices wired together.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

The design and manufacture of magnetic devices can present a number of challenges, particularly for those magnetic devices operating at high voltage in a power range of tens of kilowatts, a current range of hundreds of amperes, and a frequency range of tens of kilohertz. For example, some disadvantages of the current approach include significant manual labor needed to install individual magnetic devices in their enclosures due, at least in part, to the difficulty of making connections to external components. In addition, cooling such magnetics assemblies is an ever-present challenge.

Accordingly, a power converter magnetics assembly is disclosed that is configured such that the amount of labor needed to install individual magnetics in the enclosure is reduced and connections to power converter components that are outside of the magnetics assembly are simplified. In one aspect, a configuration for cooling the power converter magnetics assembly is disclosed. The power converter magnetics assembly can include an interface panel, a magnetic component mounted to the interface panel to form a magnetics subassembly, and a chassis coupled to the magnetics subassembly. The chassis can have a cavity with an opening. The magnetic component can be received within the cavity and the interface panel can be disposed over the opening and secured to the chassis to form an enclosure about the magnetic component.

In one aspect, a power converter module is disclosed. The power converter module can include a support structure and a power converter magnetics assembly coupled to the support structure. The power converter magnetics assembly can have an interface panel, a magnetic component mounted to the interface panel to form a magnetics subassembly, and a chassis coupled to the magnetics subassembly. The chassis can have a cavity with an opening. The magnetic component can be received within the cavity and the interface panel can be disposed over the opening and secured to the chassis to form an enclosure about the magnetic component.

Figure 1:
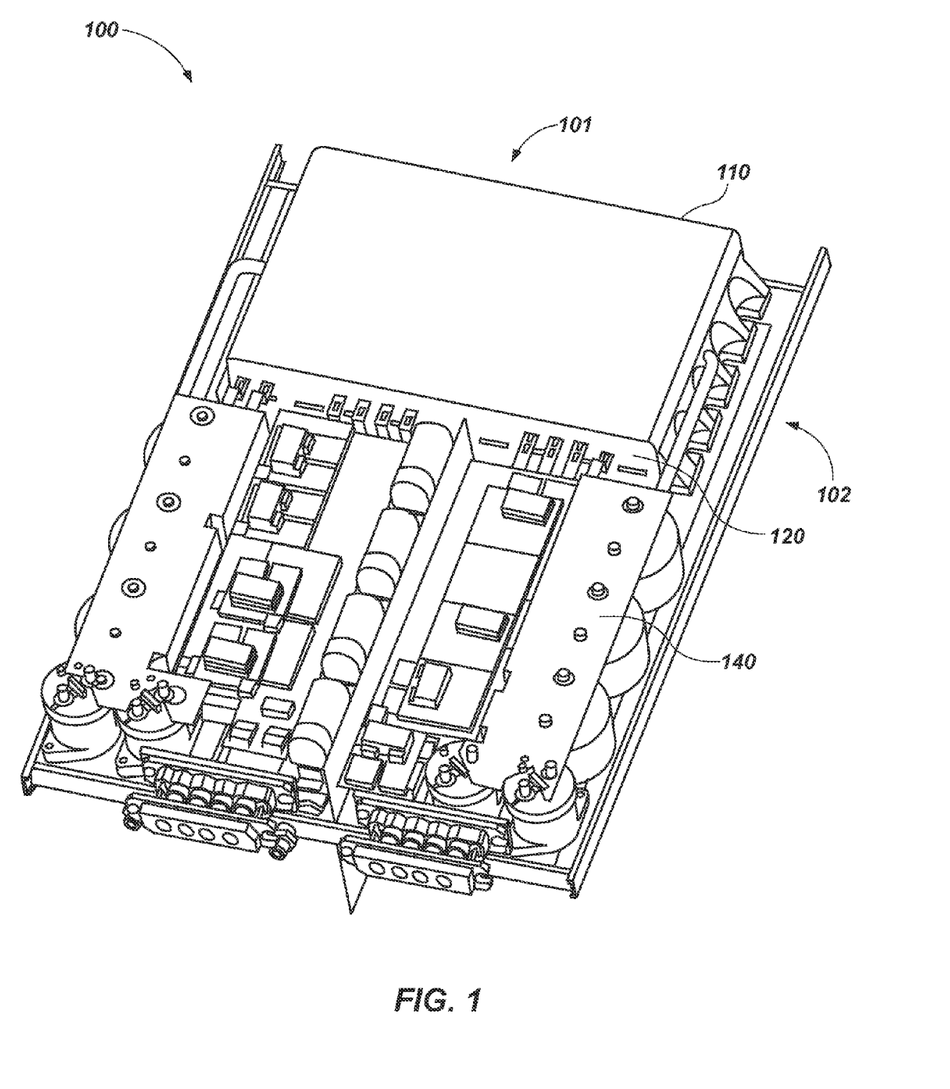
FIG. 1 is an example illustration of a power converter module in accordance with an example of the present disclosure.

One embodiment of a power converter module 100 is illustrated in FIG. 1. The power converter module 100 can comprise a power converter magnetics assembly 101 and a support structure 102. The power converter magnetics assembly 101 can be coupled to the support structure 102, as shown in the figure. It should be recognized that the power converter module 100 can be any suitable type of power converter and can include any type or quantity of independent magnetic devices, such as transformers, resonant inductors, and/or current transformers.

Figure 2:
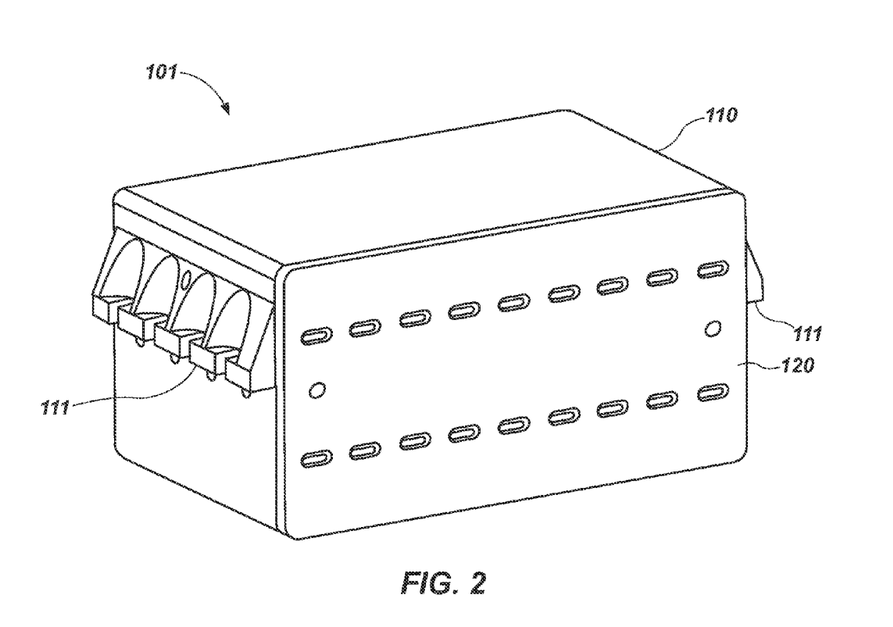
FIG. 2 is a power converter magnetics assembly of the power converter module of FIG. 1.
Figure 3:
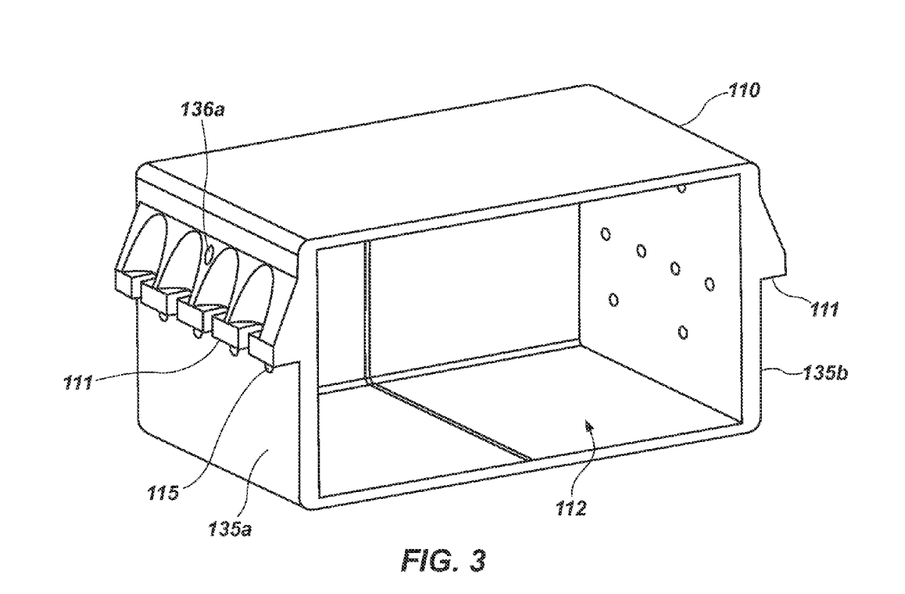
FIG. 3 is a chassis of the power converter magnetics assembly of FIG. 2.
Figure 4:
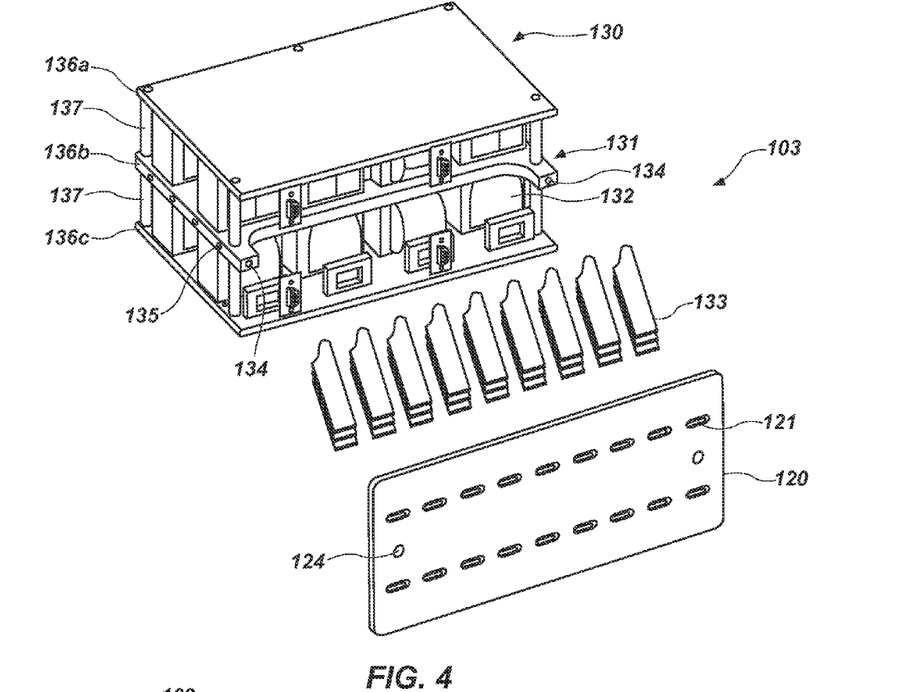
FIG. 4 is an exploded view of a magnetics subassembly of the power converter magnetics assembly of FIG. 2.
Figure 5:
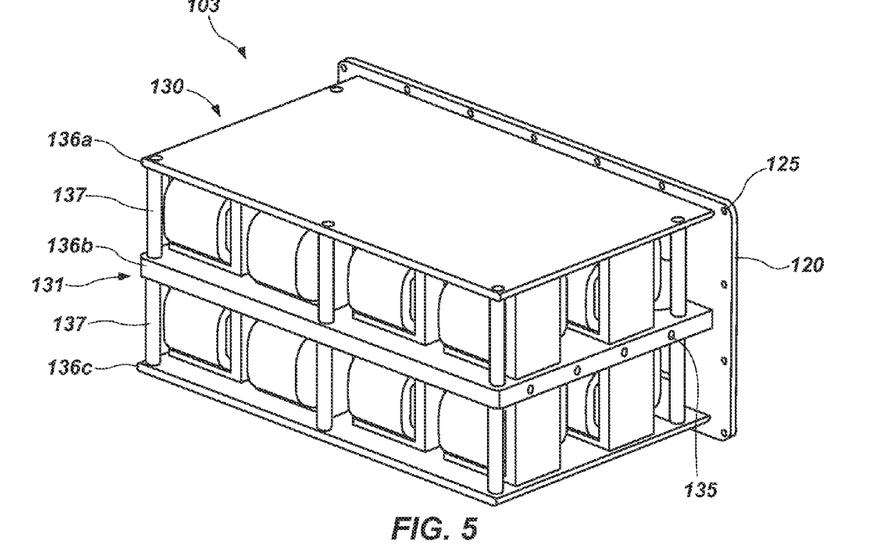
FIG. 5 is a perspective view of the magnetics subassembly of FIG. 4.

With continuing reference to FIG. 1, FIGS. 2-6 illustrate aspects of the power converter magnetics assembly 101 and its manufacture. FIG. 2 illustrates the power converter magnetics assembly 101 isolated from the support structure 102. The power converter magnetics assembly 101 can have a chassis 110 and an interface panel 120, which can form a "two-part" enclosure. The chassis 110 can have one or more mounting features 111 to facilitate coupling the chassis 110 to the support structure 102. In one aspect, illustrated in FIG. 3, the chassis 110 can have a cavity 112 with an opening. In another aspect, illustrated in FIG. 4, the power converter magnetics assembly 101 can have a magnetics subassembly 103 formed by a magnetic component 130 mounted to the interface panel 120. The magnetic component 130 can include a frame 131 and one or more magnetic devices 132 coupled to the frame 131. The frame 131 can provide structural support for the magnetic devices 132. As shown in FIG. 5, the frame 131 can be coupled to the interface panel 120, which can couple the magnetic component 130 to the interface panel 120 to form the magnetics subassembly 103. The magnetics subassembly 103 can be coupled to the chassis 110 as shown in FIG. 2. In other words, all magnetic devices 132 can be coupled to the interface panel 120 and then inserted into the chassis 110. In particular, the magnetic component 130 can be received within the cavity 112 and the interface panel 120 can be disposed over the opening and secured to the chassis 110 to form an enclosure about the magnetic component 130.

The frame 131 can include any suitable number or type of structural components. For example, the frame 131 can include upper, middle, and lower platforms 136a-c, which can be coupled to one another and separated by one or more columns 137. The frame 131 and the interface panel 120 can be coupled to one another in any suitable manner. For example, the frame 131 and the interface panel 120 can include holes 134, 124, respectively, to facilitate coupling with fasteners. Similarly, the magnetics subassembly 103 and the chassis 110 can be coupled to one another in any suitable manner. For example, the frame 131 and the chassis 110 can include holes 135, 115, respectively, to facilitate coupling with fasteners. In addition, the interface panel 120 can include holes 125 to facilitate coupling the interface panel 120 to the chassis 110 with fasteners. In one aspect, the coupling of the frame 131 and the chassis 110 can be configured to provide primary structural support for the coupling of the magnetics subassembly 103 and the chassis 110, while the coupling of the interface panel 120 to the frame 131 can assemble the magnetics subassembly 103 and locate the interface panel 120 relative to the frame 131 and magnetic devices 132.

In one aspect, the interface panel 120 can have one or more access ports 121 to facilitate an electrical connection of the one or more magnetic devices 132 to one or more electrical components located outside the enclosure through the interface panel 120. In another aspect, one or more termination tabs 133 can be electrically coupled to the one or more magnetic devices 132 to electrically couple the one or more magnetic devices 132 to the one or more electrical components located outside the enclosure. Thus, the termination tabs 133 can extend at least partially through the access ports 121 to facilitate electrically coupling with an external electrical component. In one aspect, the termination tabs 133 can be an extension of the magnetic devices 132, such as an end of a wire winding for a magnetic device. The termination tabs 133 can be extended through the access ports 121 prior to coupling the interface panel 120 to the frame 131.

Figure 6:
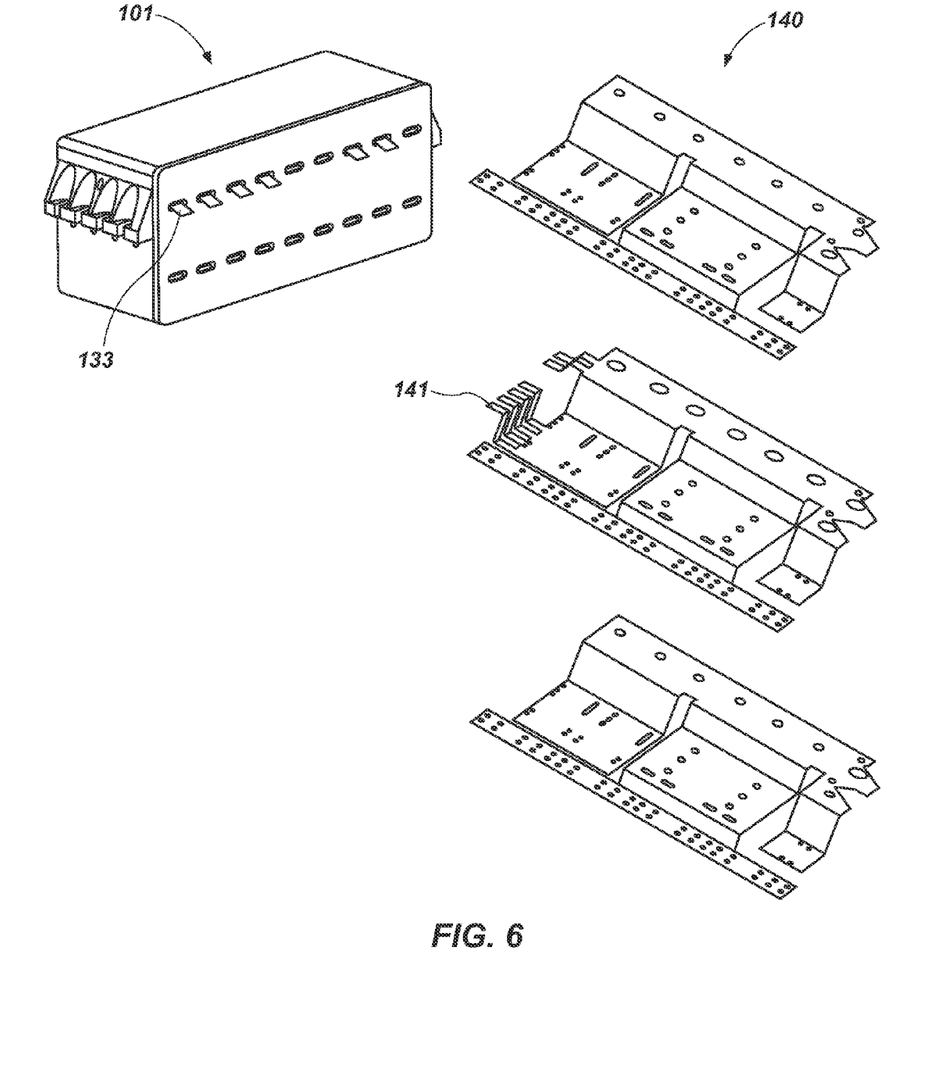
FIG. 6 illustrates a coupling of the power converter magnetics assembly of FIG. 2 and a bus bar in accordance with an example of the present disclosure.

FIG. 6 illustrates a coupling of the power converter magnetics assembly 101 and a bus bar 140. In the example illustrated, the bus bar 140 comprises multiple (three) components, however the bus bar 140 can be of any suitable configuration. The bus bar 140 can have one or more interface tabs 141 to provide for the overall "wiring" of the power converter magnetics assembly 101. In one aspect, the bus bar 140 can be an integral part of the power converter magnetics assembly 101 and can facilitate connections to external components. For example, the bus bar 140 can be coupled to the termination tabs 133, thereby integrating the bus bar with the power converter magnetics assembly 101.

To manufacture or fabricate the power converter magnetics assembly 101, the individual magnetic devices 132 can be interconnected or electrically coupled to one another as appropriate. The magnetic devices 132 can then be installed and coupled to the frame 131. The termination tabs 133 can be coupled to the magnetic devices 132. The interface tabs 141 of the bus bar 140 and/or the termination tabs 133 can be inserted through the access ports 121 in the interface panel 120. The termination tabs 133 of the magnetic devices 132 can be coupled to the interface tabs 141 of the bus bar 140. The interface panel 120 can be coupled to the frame 131. The completed magnetics subassembly 103 can then be coupled to the chassis 110 be inserting the magnetic component 130 into the cavity 112 and coupling the interface panel 120 to the chassis 110. It is noted that no specific order is required in this process. For example, the termination tabs 133 and/or the interface tabs 141 can be inserted into the interface panel 120 prior to coupling the termination tabs 133 to the magnetic devices 132. It is also noted that other modifications of this process are possible. For example, the termination tabs 133 can be made an integral part of the bus bar 140, which can eliminate the interface tabs 141.

The two-part enclosure can facilitate assembling all magnetic devices 132 onto the interface panel 120, interconnecting them with unencumbered access to the individual magnetic devices 132 and inserting the finished magnetics subassembly 103 into the chassis 110. Mounting magnetic devices 132 onto one wall of the enclosure (i.e., the interface panel 120 via the frame 131) can minimize or reduce labor needed to install individual magnetic devices in the enclosure and can facilitate installation of the magnetic devices in a densely packaged enclosure. For example, assembling the magnetic devices 132 onto various frame components (i.e., platforms 136a-c) can provide access for interconnecting the magnetic devices 132, as desired, prior to insertion into the chassis 110 can be a simple and reliable method of assembly for multiple magnetic devices 132 into a single unit. In addition, the termination tabs 133 and/or the interface tabs 141 can facilitate electrical connections to power converter components that are outside of the enclosure.

Figure 7:
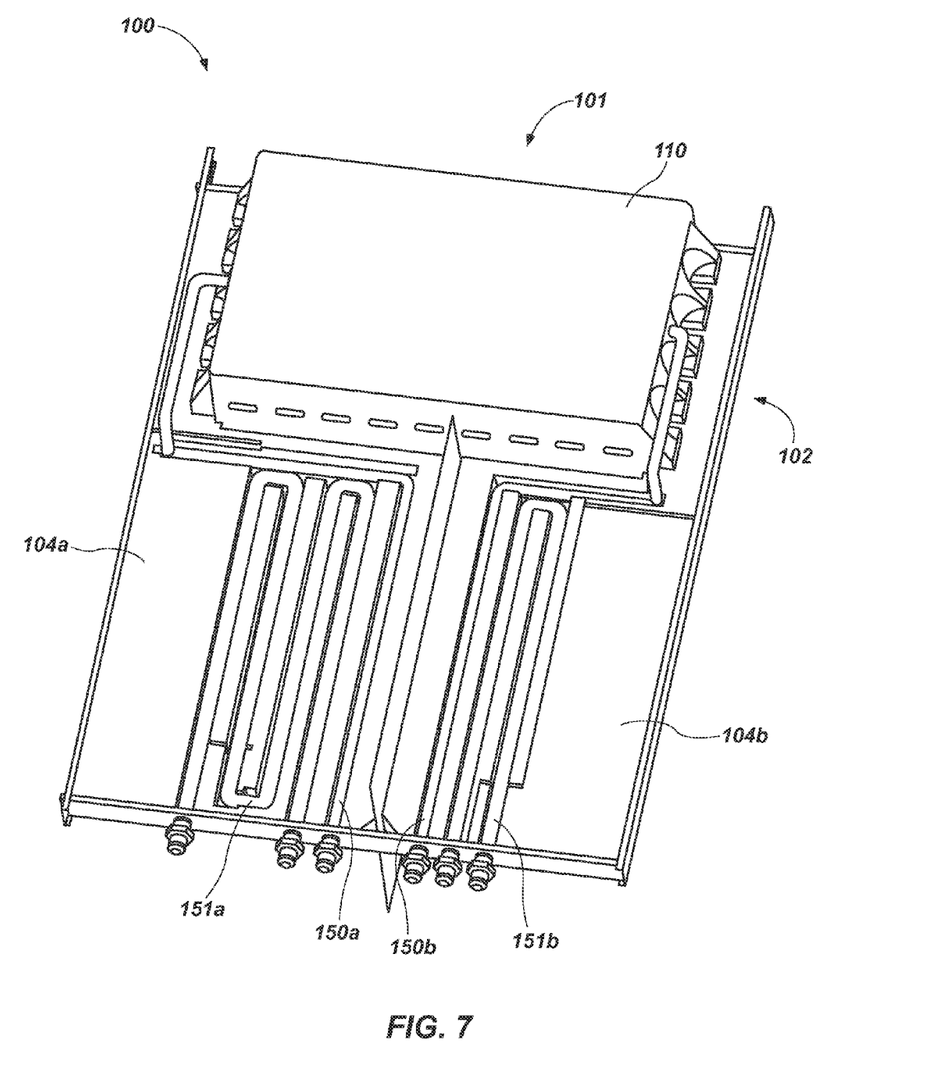
FIG. 7 illustrates the power converter module of FIG. 1 with electrical components omitted to reveal a cold plate.

FIG. 7 illustrates the power converter module 100 of FIG. 1 with electrical components omitted to reveal certain aspects of the support structure 102. In one aspect, the support structure 102 can comprise a cold plate 104a, 104b for cooling various components of the power converter module 100. The power converter module 100 can include one or more coolant conduits 150a, 150b, 151a, 151b that are coupled to a heat exchanger or refrigeration unit (not shown) to provide circulation of coolant for the power converter module 100. For example, the coolant conduit 151a can serve to cool the cold plate 104a and the coolant conduit 151b can serve to cool the cold plate 104b. In addition, the cold plate 104a can be on a delivery side of the coolant for the power converter magnetics assembly 101 and cold plate 104b can be on a return side of the coolant for the power converter magnetics assembly 101. Accordingly, the coolant conduit 150a can serve as a coolant delivery conduit and the coolant conduit 150b can serve as a coolant return conduit. In one aspect, the coolant delivery conduit 150a and the coolant return conduit 150b can be thermally coupled to the cold plates 104a, 104b, respectively.

Figure 8A:
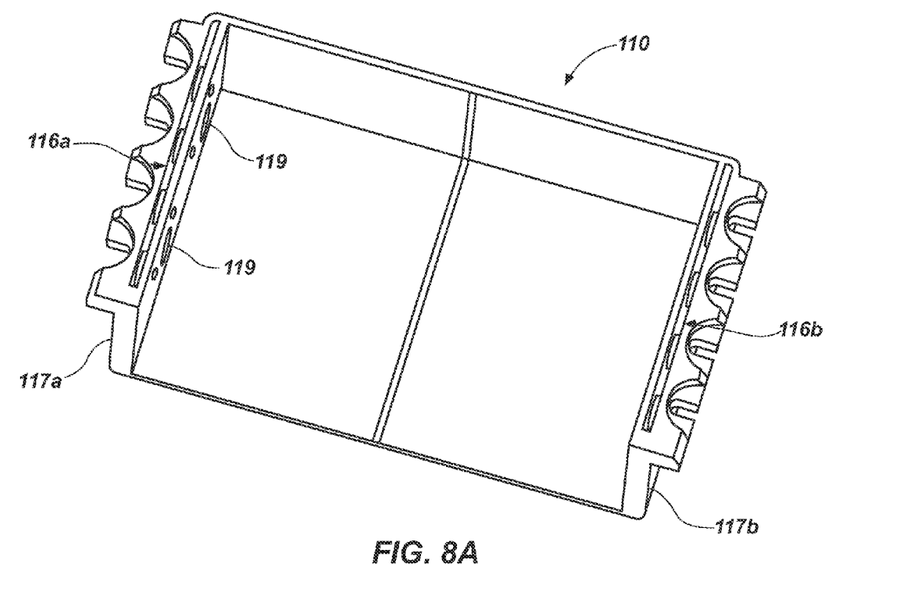
FIG. 8A is a section view of the chassis of FIG. 3 showing a coolant duct in accordance with an example of the present disclosure.
Figure 8B:
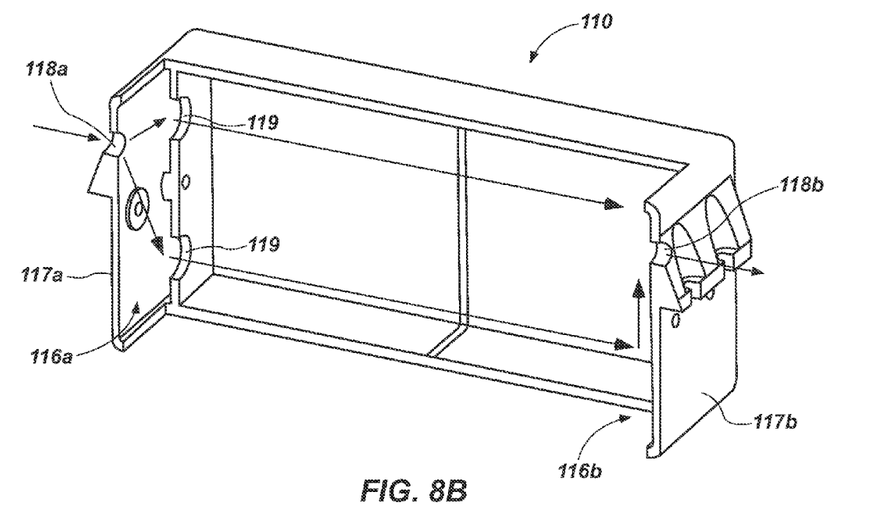
FIG. 8B is a section view of the chassis of FIG. 3 showing a coolant duct coolant flow in accordance with an example of the present disclosure.

With reference to FIGS. 3, 8A, and 8B, and continuing reference to FIG. 7, the chassis 110 of the power converter magnetics assembly 101 is illustrated. The chassis 110 can have a coolant duct 116a, 116b, which can be in fluid communication with the coolant delivery conduit 150a and the coolant return conduit 150b to cool the power converter magnetics assembly 101, such as the magnetic component 130. The chassis 110 can have one or more walls 117a, 117b with the coolant duct 116a, 116b formed therein. In one aspect, the wall 117a can include the coolant duct 116a and the wall 117b, opposite the wall 117a about the cavity 112, can include the coolant duct 116b. Thus, coolant can enter the cavity 112 via the coolant duct 116a and exit the cavity 112 via the coolant duct 116b, as illustrated in FIG. 8B. The wall 117a can include an inlet port 118 on an exterior of the chassis 110 and a plurality of outlet ports 119 on an interior of the chassis 110 to distribute coolant to the cavity 112 from the coolant delivery conduit 150a. Similarly, the wall 117b can include one or more inlet ports (hidden from view) on the interior of the chassis 110 and an outlet port 118b to collect coolant from the cavity 112 and deliver the coolant to the coolant return conduit 150b.

With further reference to FIGS. 1, 4, 6, and 7, the electrical components (e.g., the bus bar 140 and associated external devices) located outside the enclosure or cavity 112 and supported by the support structure 102 can be electrically coupled to the magnetic component 132 inside the enclosure. In one aspect, the bus bar 140 can be thermally coupled to the magnetic component 132 to cool the bus bar 140. For example, the coupling of the termination tabs 133 and the interface tabs 141, as described above, can be effective to thermally couple the termination tabs 133 and the interface tabs 141. Due to the cooling of the magnetic components 132 and/or the termination tabs 133, the bus bar 140 can also receive some cooling benefit. Thus, the cooling of the internal magnetic components 132 and/or the termination tabs 133 can also serve to cool the bus her 140, which can be located external to the enclosure or cavity 112 and can be thermally remote or isolated from the cold plate 104a, 104b.

In accordance with one embodiment of the present invention, a method of manufacturing a power converter magnetics assembly is disclosed. The method can comprise obtaining an interface panel. The method can also comprise obtaining a magnetic component. The method can further comprise obtaining a chassis having a cavity with an opening. The method can still further comprise mounting the magnetic component to the interface panel to form a magnetics subassembly. Additionally, the method can comprise coupling the magnetics subassembly to the chassis, wherein the magnetic component is received within the cavity and the interface panel is disposed over the opening and secured to the chassis to form an enclosure about the magnetic component. It is noted that no specific order is required in this method, though generally in one embodiment, these method steps can be carried out sequentially.

In one aspect, the method can further comprise coupling at least one magnetic device coupled to a frame to form the magnetic component. In another aspect of the method, mounting the magnetic component to the interface panel comprises coupling the frame to the interface panel. In yet another aspect, the method can further comprise electrically coupling at least one termination tab to at least one magnetic device of the magnetic component to facilitate an electrical connection of the at least one magnetic device to at least one electrical component located outside the enclosure through the interface panel. In still another aspect, the method can further comprise extending the at least one termination tab at least partially through at least one access port of the interface panel to facilitate an electrical connection of the at least one magnetic device to at least one electrical component located outside the enclosure through the interface panel.

It is to be understood that the embodiments of the invention disclosed are not limited to the particular structures, process steps, or materials disclosed herein, but are extended to equivalents thereof as would be recognized by those ordinarily skilled in the relevant arts, It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A power converter magnetics assembly, comprising:
   an interface panel;
   a magnetic component mounted to the interface panel to form a magnetics subassembly; and
   a chassis coupled to the magnetics subassembly, the chassis having a cavity with an opening, wherein the magnetic component is received within the cavity through the opening and the interface panel is disposed over the opening and secured to the chassis to form an enclosure about the magnetic component.

2. The power converter magnetics assembly of claim 1, wherein the chassis comprises a coolant duct.

3. The power converter magnetics assembly of claim 1, wherein the chassis comprises at least one wall with a coolant duct formed therein.

4. The power converter magnetics assembly of claim 3, wherein the at least one wall comprises a first wall with a first coolant duct and a second wall, opposite the first wall about the cavity, with a second coolant duct, such that coolant enters the cavity via the first coolant duct and exits the cavity via the second coolant duct.

5. The power converter magnetics assembly of claim 3, wherein the at least one wall comprises an inlet port on an exterior of the chassis and a plurality of outlet ports on an interior of the chassis to distribute coolant to the cavity.

6. The power converter magnetics assembly of claim 1, wherein the magnetic component comprises a frame and at least one magnetic device coupled to the frame, and wherein the frame is coupled to the interface panel.

7. The power converter magnetics assembly of claim 6, wherein the interface panel comprises at least one access port to facilitate an electrical connection of the at least one magnetic device to at least one electrical component located outside the enclosure through the interface panel.

8. The power converter magnetics assembly of claim 7, further comprising at least one termination tab electrically coupled to the at least one magnetic device to electrically couple the at least one magnetic device to the at least one electrical component located outside the enclosure.

9. The power converter magnetics assembly of claim 1, wherein the chassis comprises a mounting feature to facilitate coupling the chassis to a support structure.

10. A power converter module, comprising:
a support structure; and
a power converter magnetics assembly coupled to the support structure, the power converter magnetics assembly having
an interface panel,
a magnetic component mounted to the interface panel to form a magnetics subassembly, and
a chassis coupled to the magnetics subassembly, the chassis having a cavity with an opening, wherein the magnetic component is received within the cavity through the opening and the interface panel is disposed over the opening and secured to the chassis to form an enclosure about the magnetic component.

11. The power converter module of claim 10, wherein the support structure comprises a cold plate.

12. The power converter module of claim 11, further comprising a coolant delivery conduit thermally coupled to the cold plate and a coolant return conduit, wherein the chassis comprises a coolant duct in fluid communication with the coolant delivery conduit and the coolant return conduit to cool the magnetic component.

13. The power converter module of claim 12, further comprising at least one electrical component located outside the enclosure and supported by the support structure, wherein the magnetic component is electrically coupled to the at least one electrical component located outside the enclosure.

14. The power converter module of claim 13, wherein the at least one electrical component located outside the enclosure comprises a bus bar.

15. The power converter module of claim 14, wherein the bus bar is thermally coupled to the magnetic component to cool the bus bar.

16. A method of manufacturing a power converter magnetics assembly, comprising:
obtaining an interface panel;
obtaining a magnetic component;
obtaining a chassis having a cavity with an opening;
mounting the magnetic component to the interface panel to form a magnetics subassembly; and
coupling the magnetics subassembly to the chassis, wherein the magnetic component is received within the cavity through the opening and the interface panel is disposed over the opening and secured to the chassis to form an enclosure about the magnetic component.

17. The method of claim 16, further comprising coupling at least one magnetic device to a frame to form the magnetic component.

18. The method of claim 17, wherein mounting the magnetic component to the interface panel comprises coupling the frame to the interface panel.

19. The method of claim 16, further comprising electrically coupling at least one termination tab to at least one magnetic device of the magnetic component to facilitate an electrical connection of the at least one magnetic device to at least one electrical component located outside the enclosure through the interface panel.

20. The method of claim 19, further comprising extending the at least one termination tab at least partially through at least one access port of the interface panel to facilitate an electrical connection of the at least one magnetic device to at least one electrical component located outside the enclosure through the interface panel.

* * * * *